United States Patent [19]

Brug et al.

[11] Patent Number: 5,216,560
[45] Date of Patent: Jun. 1, 1993

[54] STABILIZATION OF MAGNETORESISTIVE SENSORS USING THE LONGITUDINAL FIELD PRODUCED BY THE CURRENT IN THE CONTACT LEADS

[75] Inventors: James A. Brug, Palo Alto; Thomas C. Anthony, Sunnyvale, both of Calif.

[73] Assignee: Hewlett-Packard Company, Palo Alto, Calif.

[21] Appl. No.: 762,244

[22] Filed: Sep. 19, 1991

Related U.S. Application Data

[63] Continuation of Ser. No. 440,562, Nov. 22, 1989, abandoned.

[51] Int. Cl.⁵ .............................................. G11B 5/39
[52] U.S. Cl. ................................... 360/113; 324/252; 338/32 R
[58] Field of Search ..................... 360/113; 324/252; 338/32 R

[56] References Cited

U.S. PATENT DOCUMENTS

| | | | |
|---|---|---|---|
| 4,012,781 | 3/1977 | Lin | 324/252 |
| 4,280,158 | 7/1981 | de Niet | 360/113 |
| 4,321,640 | 3/1982 | van Gestel | 360/113 |
| 4,443,826 | 4/1984 | Sawada et al. | 360/113 |
| 4,803,580 | 2/1989 | Mowry | 360/113 |
| 4,987,509 | 1/1991 | Gill et al. | 360/113 |
| 5,027,243 | 6/1991 | Gill et al. | 360/113 |

OTHER PUBLICATIONS

C. Tsang et al, "Study of domain formation in small permalloy magnetoresistive elements," Journal of Applied Physics, vol. 53, p. 2602 (1982).

N. Smith, "A specific model for domain-wall nucleation in thin-film Permalloy microelements," Journal of Applied Physics, vol. 63, p. 2932 (1988).

*Primary Examiner*—John H. Wolff
*Assistant Examiner*—Craig A. Renner

[57] ABSTRACT

A magnetoresistive sensor having a longitudinal field that is produced along its axis and that stabilizes the sensor. The longitudinal field is produced by the current in conductors that are connected to the magnetoresistive sensor elements. By controlling the direction and distribution of the current in the conductors, a longitudinal field is produced that has the required direction and magnitude to stabilize the single domain state of the sensor. The resulting lack of domain wall motion in the sensor during operation prevents instabilities in its electrical output, commonly known as Barkhausen noise. Four different sensor designs are provided that include two single element sensors with two conductors, a dual element sensor with four conductors, and a dual element sensor with three conductors. The ease of implementation makes the stabilized sensor of the present invention superior to conventional approaches that rely on permanent magnets or exchange coupled layers to provide longitudinal bias.

7 Claims, 2 Drawing Sheets

STABILIZATION OF MAGNETORESISTIVE SENSORS USING THE LONGITUDINAL FIELD PRODUCED BY THE CURRENT IN THE CONTACT LEADS

This application is a continuation of U.S. patent application Ser. No. 07440,562, filed Nov. 22, 1989, now abandoned.

BACKGROUND

The present invention relates generally to magnetoresistive sensors, and more particularly, to magnetoresistive sensors that use the longitudinal fields produced by their current conductors to stabilize the sensors.

The formation of domains in magnetoresistive heads has long been a problem in magnetic recording because of the resulting domain-induced Barkhausen noise. Before the magnetoresistive element is used, it is typically initialized into a single domain state by the application of a strong easy axis field. The production of a multi-domain state from the single domain state, or destabilization, has previously been shown to result from longitudinal fields that oppose the magnetization direction. For example, see articles by C. Tsang et al, in *Journal of Applied Physics*, Vol. 53, at page 2602 (1982), and N. Smith, in *Journal of Applied Physics*, Vol. 63, at page 2932 (1988). These longitudinal fields arise from a number of sources. In the model proposed by Tsang et al., the longitudinal fields are produced by the magnetic poles at the ends of the magnetoresistive element. During application of a transverse field, these demagnetizing fields promote a buckled magnetization structure. This structure relaxes to a multi-domain state when the transverse field is reduced. The model by Smith explains the production of multi-domain states by utilizing the longitudinal field that results from a misalignment of the external field. In both studies the presence of a longitudinal field that opposes the magnetization in the single domain state destabilizes the magnetoresistive element.

An additional source of a longitudinal field in conventional magnetoresistive heads arises from the sense current used to measure the resistance of the magnetoresistive element. The influence of these currents on magnetoresistive behavior has previously been discussed in barber pole magnetoresistive heads. For example, see the articles by J. S. Y. Feng, et al. in *IEEE Transactions on Magnetics*, Vol MAG-13, at page 1466 (1977), and W. Metzdorf et al., in *IEEE Transactions on Magnetics*, Vol MAG-18, at page 763 (1982). In these barber pole heads, conductors are placed on top of the magnetoresistive element at an angle to the easy axis. A vertical component of the current exists in the conductor and produces a longitudinal field along the easy axis that helps to stabilize a single domain state. However, for narrow track width applications the slanted conductors in barber pole configurations are not desirable and instead the conductors are brought in perpendicular to the magnetoresistive element. However, even this simple configuration is affected by the fields from the currents. These fields are present on either side of the track and they can either stabilize or destabilize the single domain state in the magnetoresistive sensor depending on the conductor configuration and the direction of the magnetization.

One of the primary mechanisms for instability in magnetoresistive sensors is due to the placement of contact leads. These contact leads provide current to the magnetoresistive sensors and they are typically placed on the same side of the magnetoresistive sensor. The currents flowing through the contact leads produce longitudinal fields that are aligned in opposite directions on either side of the active area of the sensor. Unfortunately, these opposing longitudinal fields produce instabilities in the magnetoresistive sensor because their orientations favor having the magnetization directed in opposite directions on either side of the active area. Regions of oppositely directed magnetization typically form domain walls between them. This tendency to form domain walls is further increased when the magnetization is oriented towards the transverse direction, a condition that occurs in magnetoresistive sensors that are biased, or during normal operation when sensing magnetic fields.

Tests were performed on a magnetoresistive sensor that was fabricated with its current leads on the same side of the magnetoresistive element. When operating in a low current condition, which implies a weak magnetic field, the response curve was smooth. However, when operated at a typical standard operating current of 25 mA, the fields associated with the current are sufficient to introduce severe instabilities in the response curve.

The currents in the contact leads of the magnetoresistive head produce fields that influence the behavior of the underlying magnetoresistive elements. In the conventional lead configuration the current enters and leaves the magnetoresistive elements on the same side of the element. In the region where the conductor overlaps the magnetoresistive element, a field is produced that has a component that is along the easy axis of the magnetoresistive element. The direction of this longitudinal field is in opposite directions on either side of the track and this destabilizes the magnetoresistive element. Barkhausen noise results from the multi-domain states that are produced.

SUMMARY OF THE INVENTION

In order to overcome the above-described instability problems, the present invention provides for a technique for stabilizing magnetoresistive sensors wherein a longitudinal field is produced along the axis of the magnetoresistive sensor. This field is produced by the current in conductors that are connected to the magnetoresistive sensor elements. By controlling the direction and distribution of the current in the conductors, a longitudinal field is produced that has the required direction and magnitude to stabilize the single domain state of the sensor. The resulting lack of domain wall motion in the sensor during operation prevents instabilities in its electrical output, commonly known as Barkhausen noise.

More specifically, each of the magnetoresistive elements is premagnetized in a predetermined direction and is adapted to conduct current in a predetermined direction. The current conductors are coupled to the magnetoresistive elements and are disposed such that currents applied thereto create magnetic fields therein whose magnetization directions do not oppose the premagnetization direction of the magnetoresistive element. Consequently, magnetic fields induced in each of the magnetoresistive elements by current flowing through the conductors are oriented either in the same direction, or in a transverse direction, relative to the premagnetization direction of the magnetoresistive element. As a result, the induced magnetic fields do not destabilize the magnetoresistive sensor.

Four different sensor designs are provided which include two single element sensors having two conductors, a dual element sensor having four conductors, and a dual element sensor having three conductors. The ease of implementation makes the sensor stabilization scheme of the present invention superior to techniques that rely on permanent magnets, or exchange coupled layers, to provide longitudinal bias.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1A:
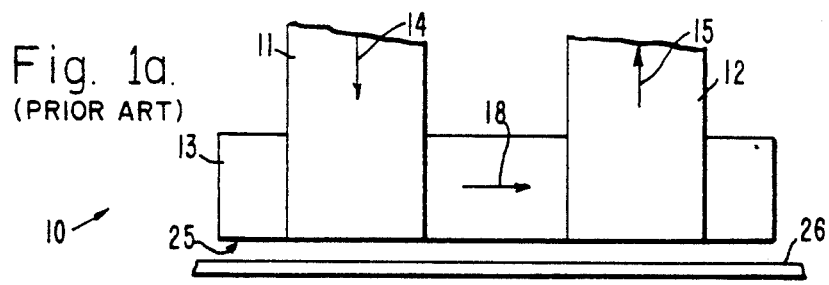
FIGS. 1a and 1b illustrate top and side views of a conventional single magnetoresistive sensor fabricated with current contacts on the same side of the sensor.
Figure 1B:
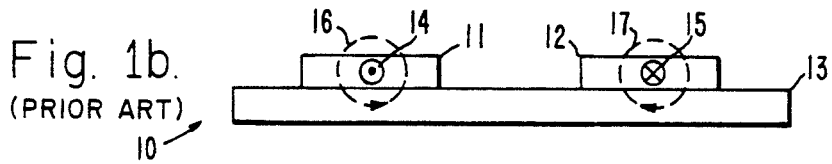

FIGS. 1a and 1b illustrate top and side views of a conventional magnetoresistive sensor 10 fabricated with current conductors 11, 12 on the same side of a single magnetoresistive element 13. The sensor 10 is disposed having its air bearing surface 25 adjacent an underlying recording disc 26. The solid arrows 14, 15, 18 in FIG. 1a and the encircled dot 14 and encircled cross 15 in FIG. 1b, indicate current paths, while circular dashed arrows 16, 17 indicate field direction. This convention will be followed in FIGS. 3, 4, and 5 described below. As is seen in FIG. 1b, the field directions 16, 17 are in opposite directions in the magnetoresistive element 13. The presence of these opposed fields in the magnetoresistive element 13 leads to instability since their orientations cause the magnetization to be directed in opposite directions on either side of the active area. Regions of oppositely directed magnetization cause domain walls to be formed between them. This tendency for domain wall formation is further increased when the magnetization is oriented towards the transverse direction, a condition that occurs in magnetoresistive sensors that are biased, or during normal operation when sensing magnetic fields.

Figure 2A:
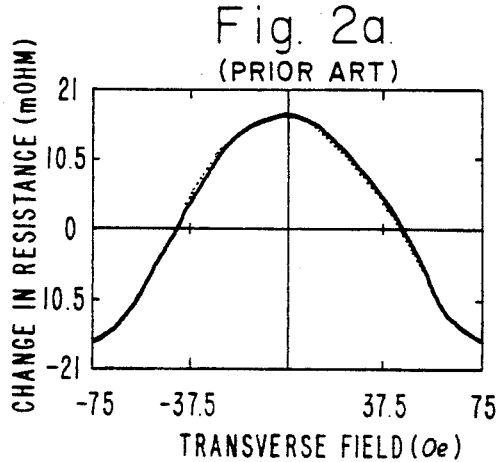
FIGS. 2a and 2b illustrate dependence of instability on the current flowing in the magnetoresistive sensor of FIG. 1.
Figure 2B:
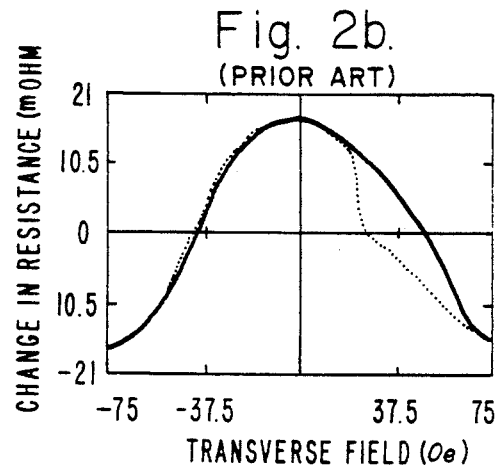

FIGS. 2a and 2b illustrate the dependence of instability on the current flowing in the magnetoresistive sensor 10 of FIG. 1. Change in resistance in milliohms is plotted along the ordinate and transverse field in Oersteds is plotted along the abscissa. The measurement shown is for the magnetoresistive sensor 10 having conductors 11, 12 on the same side of the magnetoresistive element 13. As shown in FIGS. 2a and 2b, a current level of 5 mA results in a stable magnetoresistive response, whereas increasing the current to 25 mA introduces unstable behavior. The solid line indicates an increasing field and the dotted line indicates a decreasing field.

Figure 3A:
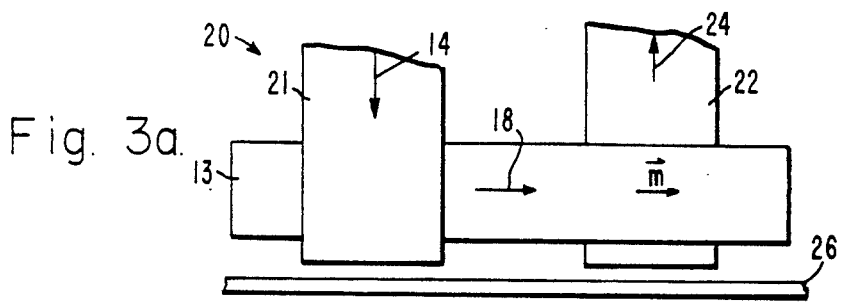
FIGS. 3a and 3b illustrate top and side views of a magnetoresistive sensor in accordance with the principles of the present invention.
Figure 3B:
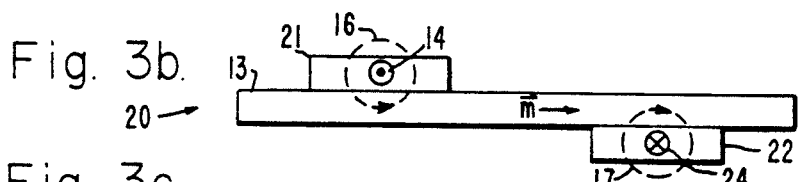

FIGS. 3a and 3b illustrate top and side views, respectively, of a magnetoresistive sensor 20 in accordance with the principles of the present invention. The magnetoresistive sensor 20 comprises two current conductors 21, 22 disposed on opposite sides of a magnetoresistive element 13, and oriented transverse to the direction of orientation of the element 13. This configuration is adapted to produce stabilizing longitudinal fields 16, 17 in the magnetoresistive element 13, as shown in FIG. 3b.

The current conductors 21, 22 are disposed on opposite sides of the magnetoresistive element 13 and are separated from one another by a predetermined distance that is substantially equal to the track width of the underlying disc 26. The track width is typically on the order of 5 microns. The fields 16, 17 produced by current 14, 24 flowing in each conductor 21, 22 are in the same direction on either side of the magnetoresistive element 13. This gives the magnetization M shown in FIG. 3a, a favored orientation that stabilizes the single domain state in the magnetoresistive element 13. The magnetic field tends to make the magnetization M relax into a single domain state.

Figure 3C:
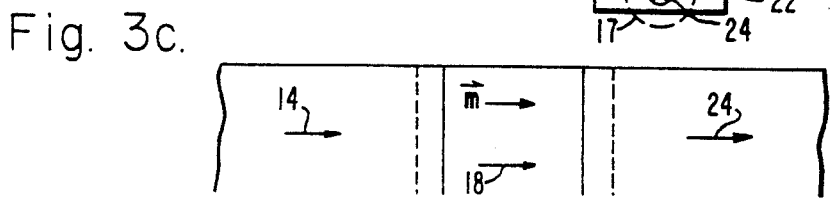
FIG. 3c illustrates a top view of an alternative embodiment of a magnetoresistive sensor shown in FIGS. 3a and 3b.

FIG. 3c shows one alternative embodiment of a magnetoresistive sensor 20a having the current conductors 21, 22 extending along the direction of the magnetoresistive element 13 in the region where they are coupled. In this embodiment, both conductors 21, 22 may be disposed above or below the magnetoresistive element 13. Alternatively, the two conductors 21, 22 may be disposed on opposite sides of the magnetoresistive element 13, similar to the embodiment shown in FIGS. 3a and 3b.

The optimal shape of the conductors 21, 22 is determined by finite element calculation of the current distribution in the magnetoresistive element 13. The shape depends on the amount of stabilization necessary to fully stabilize the sensor 20 and the uniformity of the current distribution in the magnetoresistive element 13. Fields due to current flow will decrease the sensitivity of the sensor 20 in the region adjacent to the track edge, or conductor edge, and the effect this has on the effective track width is also a design consideration. The shape of the magnetoresistive elements 13 is optimized by considering the demagnetizing effects due to the shape of the magnetoresistive elements 13 and the presence of domain walls that are present at the ends of the elements 13.

Figure 4A:
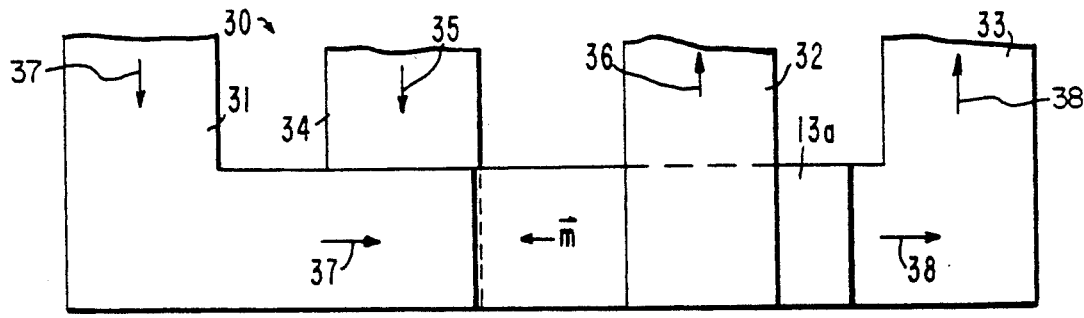
FIGS. 4a and 4b illustrate top and side views of a dual element magnetoresistive sensor in accordance with the present invention employing four conductors that stabilize the single domain state.
Figure 4B:
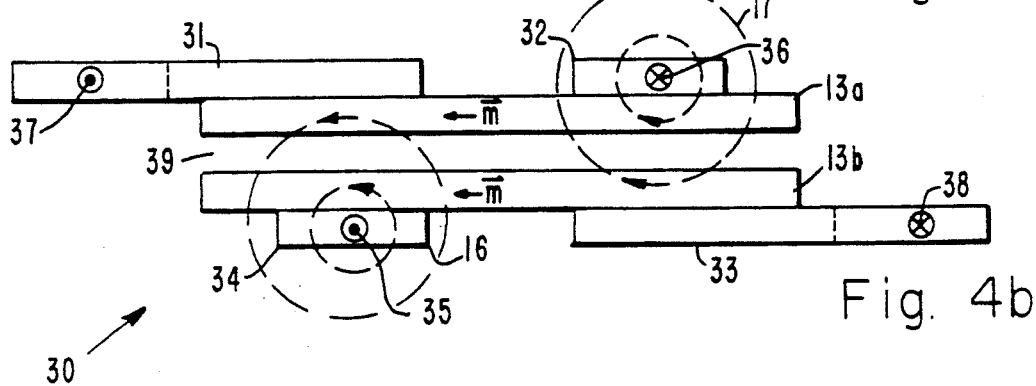

FIGS. 4a and 4b illustrate a dual element magnetoresistive sensor 30 made in accordance with the principles of the present invention. The solid arrows 35, 36, 37, and 38 in FIG. 4a and the encircled dots 34, 37 and encircled crosses 36, 38 in FIG. 4b indicate current paths. The dual element magnetoresistive sensor 30 employs four conductors 31, 32, 33, 34 that are adapted to produce a stabilized single domain state in its magnetoresistive elements 13a, 13b. The differences between this design and a conventional dual element magnetoresistive sensor comprise the shape and orientation of the four conductors 31, 32, 33, 34. The magnetoresistive sensor 30 comprises two magnetoresistive elements 13a, 13b, each having two conductors 31, 32, and 33, 34, respectively, disposed on distal opposite surfaces thereof. The two magnetoresistive elements 13a, 13b have dielectric material 39 disposed therebetween.

The four conductors 31, 32, 33, 34 are disposed such that longitudinal fields 16, 17 produced thereby in both magnetoresistive elements 13a, 13b are oriented in substantially the same direction on either side of the active area. In addition, two of the conductors 31, 33 are L-shaped so that the majority of the current conducted therethrough is in the longitudinal direction, along the length of the magnetoresistive elements 13a, 13b to which they are coupled. The fields produced by the L-shaped conductors 31, 33 are therefore oriented entirely along a direction transverse to the orientation of the magnetoresistive elements 13a, 13b in their coupling regions, and therefore they do not oppose the longitudinal fields 16, 17 produced by the other two (transverse) conductors 32, 34. The magnetoresistive elements 13a, 13b are spaced relatively close together, on the order of 50 nanometers separation, and the longitudinal fields produced by the the two (transverse) conductors 32, 34 are sufficient to stabilize both magnetoresistive elements 13a, 13b. Ease of processing makes the stabilized dual element magnetoresistive sensor 30 superior to conventional sensors that rely on permanent magnets or exchange coupled layers to provide longitudinal bias.

Figure 5A:
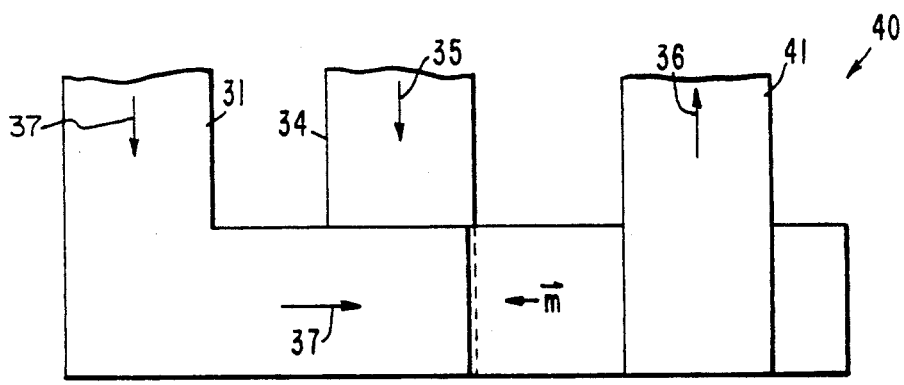
FIGS. 5a and 5b illustrate top and side views of an alternative magnetoresistive sensor employing three conductors wherein the magnetoresistive elements are shorted on one side of the active area.
Figure 5B:
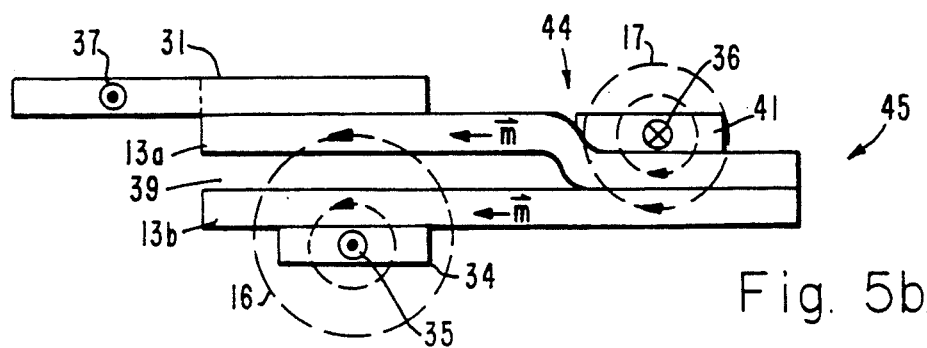

FIGS. 5a and 5b illustrate an embodiment of another dual element magnetoresistive sensor 40 in accordance with the principles of the present invention employing three conductors 31, 41, 34. The solid arrows 35, 36, 37 in FIG. 5a and the encircled dots 35, 37 and encircled cross 36 in FIG. 5b indicate current paths. In this magnetoresistive sensor 40, the magnetoresistive elements 13a, 13b are oriented substantially parallel along most of their length, and are shorted on one side 45 of the active area of the sensor 40. The magnetoresistive elements 13a, 13b are separated by dielectric material 39 in the region where they are unshorted. This design requires an additional processing step to open a via 44 that permits fabrication of a dual-layer magnetoresistive element 13a as shown in FIG. 5b. The reduced number of conductors 31, 41, 34 is advantageous in certain applications.

Thus there has been described new and improved magnetoresistive sensors that use the longitudinal fields produced by their current conductors to stabilize the sensors. It is to be understood that the above-described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A magnetoresistive sensor having improved stability comprising:

a first magnetoresistive element having a premagnetized magnetic field that is oriented in a predetermined direction and wherein the first magnetoresistive element is adapted to conduct current in the predetermined direction, and wherein the first magnetoresistive element has two sides, and wherein a first current conductor is disposed on one side and is oriented generally orthogonal to the predetermined direction, and wherein a second current conductor is disposed on the other side and is oriented generally orthogonal to the predetermined direction, and is separated laterally from the first current conductor by a predetermined distance; and said first and second current conductors coupled to the first magnetoresistive element that are disposed such that currents applied to the first and second current conductors create first and second magnetic fields in the first magnetoresistive element whose orientations do not oppose the orientation of the premagnetized magnetic field of the first magnetoresistive element, whereby the first and second magnetic fields are oriented to not destabilize the magnetoresistive sensor.

2. A magnetoresistive sensor having improved stability comprising:

a first magnetoresistive element having two sides that is premagnetized in a predetermined direction and that is adapted to conduct current in the predetermined direction;

first and second current conductors coupled to the first magnetoresistive element, such that the first current conductor is disposed on one side of the first magnetoresistive element and is oriented generally orthogonal to the predetermined direction, and such that the second current conductor is disposed on the other side of the first magnetoresistive element and is oriented generally orthogonal to the predetermined direction, and is separated laterally from the first current conductor by a predetermined distance;

a second magnetoresistive element separated a predetermined spacing from the first magnetoresistive element along a portion of its length, and which is premagnetized in the predetermined direction and adapted to conduct current in the predetermined direction, and wherein the first and second magnetoresistive elements are coupled together adjacent the second current conductor; and a third current conductor coupled to the second magnetoresistive element and oriented along the predetermined direction adjacent an area where they are coupled, and that is disposed laterally from the second current conductor by the predetermined distance;

whereby magnetic fields induced in the first and second magnetoresistive elements by the currents flowing through the conductors are oriented in the predetermined direction or are orthogonal to the predetermined direction, and thereby do not destabilize the magnetoresistive sensor.

3. A magnetoresistive sensor having improved stability comprising:

a first magnetoresistive element having two sides that is premagnetized in a predetermined direction and that is adapted to conduct current in the predetermined direction;

first and second current conductors coupled to the first magnetoresistive element such that the first current conductor is disposed on one side of the first magnetoresistive element and is oriented generally orthogonal to the predetermined direction, and such that the second current conductor is disposed on the other side of the first magnetoresistive element and is oriented generally orthogonal to the predetermined direction, and wherein the first and second current conductors are separated laterally from each other by a predetermined distance;

a second magnetoresistive element that is disposed substantially parallel to and is dielectrically separated from the first magnetoresistive element along a portion of its length, and wherein the second magnetoresistive element is adapted to conduct current in the predetermined direction, and wherein the second magnetoresistive element is interposed between the second current conductor and the first magnetoresistive element and is shorted to the first magnetoresistive element adjacent the second current conductor, and a third current conductor coupled to the second magnetoresistive element and having a first portion that is oriented along the predetermined direction and that is separated from the second current conductor by the predetermined distance, and having a second portion oriented generally orthogonal to the predetermined direction and which is separated laterally from the second magnetoresistive element;

whereby magnetic fields induced in the first and second magnetoresistive elements by the currents flowing through the first and second current conductors are oriented in the predetermined direction, and thereby do not destabilize the magnetoresistive sensor.

4. A magnetoresistive sensor having improved stability comprising:

a first magnetoresistive element having a premagnetized magnetic field that is oriented in a predetermined direction and wherein the first magnetoresistive element is adapted to conduct current in the predetermined direction, and wherein the first magnetoresistive element has two sides, and wherein a first current conductor is disposed on one of the sides and has a first portion coupled to one end of the first magnetoresistive element and is oriented along the predetermined direction, and wherein a second portion of the first current conductor is oriented generally orthogonal to the predetermined direction, and is disposed laterally from the first magnetoresistive element so as not to contact it, and wherein a second current conductor is disposed on one of the sides and is oriented generally orthogonal to the predetermined direction, and is separated laterally from the first current conductor by a predetermined distance; and said first and second current conductors coupled to the first magnetoresistive element that are disposed such that currents applied to the first and second current conductors create first and second magnetic fields in the first magnetoresistive element whose orientations do not oppose the orientation of the premagnetized magnetic field of the first magnetoresistive element, whereby the first and second magnetic fields are oriented to not destabilize the magnetoresistive sensor.

5. The magnetoresistive sensor of claim 4 which further comprises:

a second magnetoresistive element having two sides that is separated a predetermined spacing from the first magnetoresistive element, and that is premagnetized in the predetermined direction, and that is adapted to conduct current in the predetermined direction;

a third current conductor disposed on one side of the second magnetoresistive element and having a first portion coupled to the second magnetoresistive element that is oriented along the predetermined direction, and having a second portion that is oriented generally orthogonal to the predetermined direction, and that is disposed laterally from the first magnetoresistive element so as not to contact it;

and wherein the first and third current conductors are disposed on opposite distal sides of the first and second magnetoresistive elements, respectively; and a fourth current conductor disposed on one side of the second magnetoresistive element that is oriented generally orthogonal to the predetermined direction and that is separated laterally from the third current conductor by the predetermined distance.

6. The magnetoresistive sensor of claim 4 which further comprises:

a second magnetoresistive element having two sides separated a predetermined spacing from the first magnetoresistive element along a portion of its length that is premagnetized in the predetermined direction and that is adapted to conduct current in the predetermined direction, and wherein the first and second magnetoresistive elements are coupled together adjacent the second current conductor; and a third current conductor disposed on an opposite distal side of the second magnetoresistive element relative to the second current conductor that is generally oriented orthogonal to the predetermined direction and that is separated laterally from the second current conductor by the predetermined distance.

7. A magnetoresistive sensor having improved stability comprising:

a first magnetoresistive element having a premagnetized magnetic field that is oriented in a predetermined direction and wherein the first magnetoresistive element is adapted to conduct current in the predetermined direction, and wherein the first magnetoresistive element has two sides, and wherein a first current conductor is disposed on one side and is oriented generally orthogonal to the predetermined direction, and wherein a second current conductor is disposed on the other side and is oriented generally orthogonal to the predetermined direction, and is separated laterally from the first current conductor by a predetermined distance;

said first and second current conductors coupled to the first magnetoresistive element that are disposed such that currents applied to the first and second current conductors create first and second magnetic fields in the first magnetoresistive element whose orientations do not oppose the orientation of the premagnetized magnetic field of the first magnetoresistive element, whereby the first and second magnetic fields are oriented to not destabilize the magnetoresistive sensor;

a second magnetoresistive element disposed substantially parallel to and dielectrically separated from the first magnetoresistive element along a portion of its length, and wherein the second magnetoresistive element is adapted to conduct current in the predetermined direction, and wherein the second magnetoresistive element is interposed between the second current conductor and the first magnetoresistive element and is shorted to the first magnetoresistive element adjacent the second current conductor; and a third current conductor coupled to the second magnetoresistive element and having a first portion that is oriented along the predetermined direction that is separated from the second current conductor by the predetermined distance, and wherein a second portion is oriented generally orthogonal to the predetermined direction, and is disposed laterally from the second magnetoresistive element;

whereby magnetic fields induced in the first and second magnetoresistive elements by the currents flowing through the first and second current conductors are oriented in the predetermined direction, whereby said magnetic fields stabilize the magnetoresistive sensor.

* * * * *